United States Patent [19]

Sugimoto et al.

[11] Patent Number: 5,540,345
[45] Date of Patent: Jul. 30, 1996

[54] PROCESS OF PRODUCING DIFFRACTION GRATING

[75] Inventors: Hiroshi Sugimoto; Teruhito Matsui; Ken-ichi Ohtsuka; Yuji Abe; Toshiyuki Ohishi, all of Hyogo, Japan

[73] Assignee: Mitsubishi Denki Kabushiki Kaisha, Tokyo, Japan

[21] Appl. No.: 172,824

[22] Filed: Dec. 27, 1993

Related U.S. Application Data

[62] Division of Ser. No. 947,891, Sep. 21, 1992, Pat. No. 5,300,190, which is a continuation of Ser. No. 701,009, May 13, 1991, abandoned, which is a continuation of Ser. No. 209,738, Jun. 22, 1988, abandoned.

[30]  Foreign Application Priority Data

| Jun. 24, 1987 | [JP] | Japan | 62-158280 |
|---|---|---|---|
| Aug. 28, 1987 | [JP] | Japan | 62-215582 |
| Oct. 1, 1987 | [JP] | Japan | 62-248450 |
| Oct. 5, 1987 | [JP] | Japan | 62-249687 |

[51] Int. Cl.⁶ ........................ H01L 21/308; C03C 15/00
[52] U.S. Cl. .................. 216/24; 216/41; 216/47; 216/79; 216/99; 216/109
[58] Field of Search ................ 216/24, 26, 41, 216/47, 49, 51, 80, 97, 79, 99, 109

[56]  References Cited

U.S. PATENT DOCUMENTS

| 4,321,282 | 3/1982 | Johnson | 427/38 |
|---|---|---|---|
| 4,774,164 | 9/1988 | Peavy et al. | 156/653 |
| 4,792,197 | 12/1988 | Inoue et al. | 350/162.2 |
| 4,806,442 | 2/1989 | Shirashi et al. | 350/162.17 |
| 4,806,454 | 2/1989 | Yoshida et al. | 350/162.11 |
| 4,826,291 | 5/1989 | Utaka et al. | 350/320 |

FOREIGN PATENT DOCUMENTS

| 58-154285 | 9/1983 | Japan | 156/656 |
|---|---|---|---|

OTHER PUBLICATIONS

Fabrication of First-order Grating for 1.5 μm DFB Laser By High Voltage Electron-Beam Lithography (Electronics Letters vol. 23, 11 pp. 590-592).

γ/4-Shifted DFB-LD Corrugation Formed by a Novel Spatial Phase Modulating Mask (Tech Digest of IOOC-ECOC '85 pp. 25-28).

γ/4-Shifted InGaAsP/InP DFB Lasers By Simultaneous Holographic Exposure of Positive and Negative Photoresists (Electronics Letters vol. 20, No. 24 pp. 1008-1010).

*Primary Examiner*—R. Bruce Breneman
*Assistant Examiner*—Anita K. Alanko
*Attorney, Agent, or Firm*—Sughrue, Mion, Zinn, Macpeak & Seas

[57] ABSTRACT

A process of producing a diffraction grating includes the steps of forming a coating layer on a first diffraction grating layer of a resin formed on a substrate without damaging the diffraction grating layer, removing a portion of the coating layer positioned on the first diffraction grating layer by etching to form a second diffraction grating layer of the coating layer having the reverse phase to that of the first diffraction grating layer, removing the first diffraction grating layer, and etching the substrate with a mask of the second diffraction grating layer, so that the diffraction grating having the reverse phase can be easily produced. When the first diffraction grating layer is left and both the first and second diffraction grating layers are used as a mask, the diffraction grating having a period half times as large as that of the first grating layer can be easily produced.

17 Claims, 12 Drawing Sheets

PROCESS OF PRODUCING DIFFRACTION GRATING

This is a divisional of application No. 07/947,891 filed Sep. 21, 1992, now U.S. Pat. No. 5,300,190, which is a continuation of application No. 07/701,009 filed on May 13, 1991, now abandoned, which is a continuation of application No. 07/209,738 filed on Jun. 22, 1988, now abandoned.

BACKGROUND OF THE INVENTION

The present invention relates to a process of producing diffraction gratings for use in distributed feedback (DFB) semiconductor lasers and more particularly to a process of producing a diffraction grating having an intermediate portion such as a quarter-wavelength shift portion where a phase is reversed.

FIGS. 1(a) and 1(b) show a conventional process of producing a diffraction grating, disclosed in, e.g., Technical Research Report OQE85-11 of Japan Electronic Communication Society or in a publication "Optical Integrated Circuits", p216, by Nishihara et al, Ohm Ltd. 1960. In FIGS. 1(a) and 1(b), there is shown a substrate 1 made of semiconductor material, together with a photosensitive resist 2 in the form of a diffraction grating. More specifically, FIG. 1(a) shows the photosensitive resist patterned into the form of a diffraction grating by the two-luminous-flux interference exposure method, whereas FIG. 1(b) shows the substrate 1 etched into the form of a diffraction grating while using the resist 2 as a mask.

Referring to FIGS. 1(a) and 1(b), the conventional process of manufacture will subsequently be described. The photosensitive resist is first applied onto the substrate 1 and the two-luminous-flux interference exposure method is employed to subject the resist to the exposure of interference fringes. Then, the resist is developed. As a result, the resist 2 patterned into the form of a diffraction grating is formed on the substrate 1 as shown in FIG. 1(a). Subsequently, the substrate 1 is etched with a mask of the resist 2 to form the diffraction grating as shown in FIG. 1(b).

In the conventional process of producing a diffraction grating, the interference exposure method simultaneously using positive and negative resists, the asymmetrical interference exposure method using a phase shift membrane, etc. must be utilized to produce the diffraction grating having a phase shift such as quarter-wavelength shift, which causes disadvantages that the process becomes complicated, interference exposure conditions becomes severe and so forth.

SUMMARY OF THE INVENTION

The present invention is intended to solve the aforesaid problems and it is therefore an object of the invention to provide a process of producing a diffraction grating with a reversed phase by means of a conventional interference exposure method.

It is another object of the present invention to provide a process of producing a diffraction grating with a phase shift by means of a conventional interference exposure method.

It is still another object of the present invention to provide a process of producing a diffraction grating with a short period applicable to a short wavelength DFB laser by means of the conventional two-luminous-flux interference exposure method.

It is an even further object of the present invention to provide a process of producing a diffraction grating applicable as a primary diffraction grating for use in a short wavelength DFB laser.

According to an aspect of the present invention, a process of producing a diffraction grating comprises the steps of forming a coating layer on a diffraction grating layer of a resin formed on a substrate without damaging the diffraction grating layer, removing a portion of the coating layer positioned on the diffraction grating layer by etching, removing the resin to form a diffraction grating layer of the coating layer having the opposite phase to the diffraction grating layer of the resin, and etching the substrate with a mask of the coating layer.

According to another aspect of the present invention, a process of producing a diffraction grating comprises the steps of forming a coating layer on a first diffraction grating layer of a resin formed on a substrate without damaging the diffraction grating layer, removing a portion of the coating layer positioned on or near the diffraction grating layer of the resin, forming a second diffraction grating layer having a period half times as large as that of the first diffraction grating layer, which is formed of the remained coating layer, the first diffraction grating layer and a space therebetween, and etching the substrate with a mask of the second diffraction grating layer.

According to still another aspect of the present invention, a process of producing a diffraction grating comprises the steps of forming a diffraction grating pattern having an alternate high flat portion and low flat portion, forming a coating layer on the diffraction grating pattern, which is etched more rapidly at a step portion than at a flat portion, removing a portion positioned on and near a step portion between the high flat portion and a low flat portion by etching, and etching the substrate with a mask of the remained coating layer.

DETAILED DESCRIPTION OF THE PREFERRED EMBODIMENTS

Referring to FIGS. 2(a)–2(d), a first embodiment of the present invention will be described. In FIGS. 2(a)–2(d), there is shown a substrate 11 made of a semiconductor material, together with a resist 12 and a silicon nitride (SiNx) layer 13 as a coating layer which is formed by, for instance, the electron cyclotron resonance chemical vapor deposition method (ECR-CVD method).

Figure 1A:
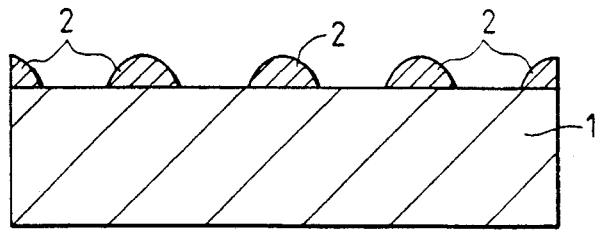
FIGS. 1 (a) and 1(b) show a conventional process of producing a diffraction grating.
Figure 1B:
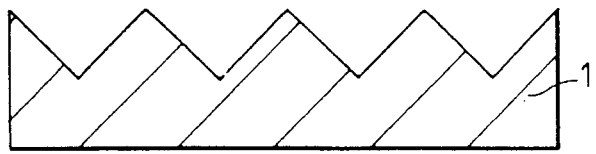
Figure 2A:
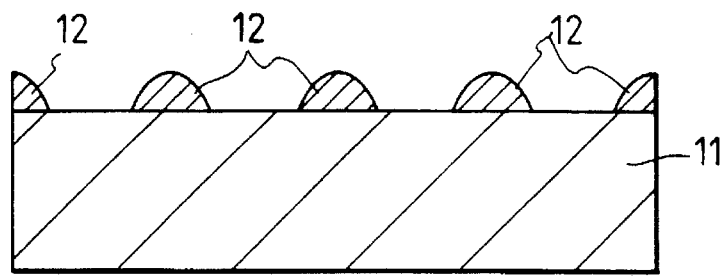
FIGS. 2(a)–2(d) ahow a process of producing a diffraction grating in accordance with a first embodiment of the present invention.

A process of producing a diffraction grating will subsequently be described. The process comprises applying a photosensitive resist onto the substrate 11, subjecting the photosensitive resist to exposure of interference fringes by the interference exposure method and developing it to form the resist 12 patterned into a diffraction grating on the substrate 11 as shown in FIG. 2(a). These steps are similar to those taken in the conventional interference exposure method referred to in FIG. 1.

Figure 2B:
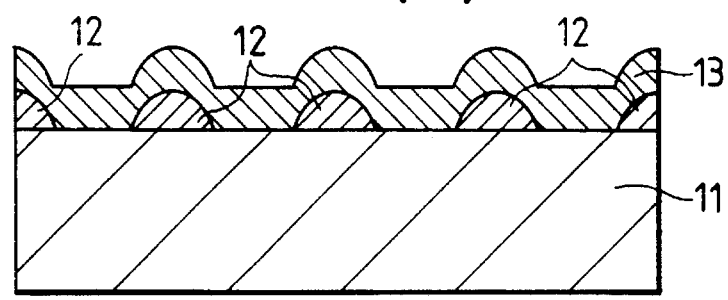

Next, as shown in FIG. 2(b), the SiNx layer 13 of about 1,000 Å thick as a coating layer is formed by the electron cyclotron resonance chemical vapor deposition method (ECR-CVD method). In the ECR-CVD method, the SiNx layer 13 is formable at low temperatures and therefore the coating layer is formed without damaging the resist 12 and the substrate 11.

Figure 2C:
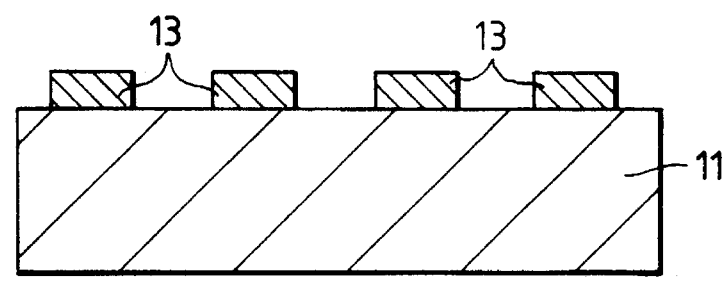

Then a buffer fluoric acid is used for etching purposes. Ammonium fluoride and fluoric acid blended at a ratio of 6 to 1, for instance, is used as the buffer fluoric acid and the etching is conducted for about one minute, whereby the SiNx layer 13 positioned on the resist 12 is completely removed, whereas the SiNx layer 13 positioned on the substrate 11 only becomes thinner, with a decrease of its thickness from about 1,000 Å by about 200 Å. This is because the rate of etching the layer 13 positioned on the substrate 11 differs from that of etching the layer 13 positioned on the resist 12. An organic solvent which will not dissolve the SiNx layer 13 is used to remove the resist 12 in the subsequent step, so that the SiNx layer 13 in the form of a diffraction grating whose phase is opposite to that of the resist 12, is formed as shown in FIG. 2(c).

Figure 2D:
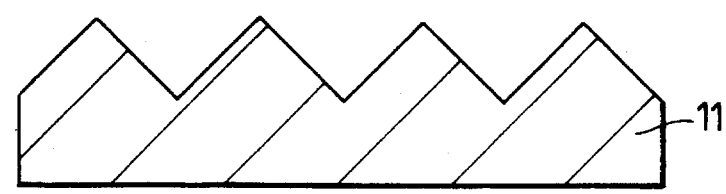

Finally, the substrate 11 is etched with a mask of the SiNx layer 13 to obtain a diffraction grating whose phase is, as shown in FIG. 2(d), opposite to what would be obtained if the substrate 11 were etched directly with a mask of the resist 12.

FIGS. 3(a)–3(d) show a second embodiment of the present invention, which illustrate a process of producing two kinds of diffraction gratings on the same substrate whose phases are similar and opposite to that of the resist, respectively. Referring now to FIGS. 3(a)–3(d), the process will be described.

Figure 3A:
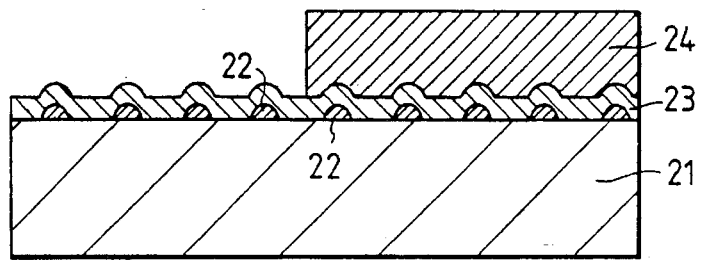
FIGS. 3(a)–3(d) show a process of producing a diffraction grating in accordance with a second embodiment of the present invention.
Figure 3B:
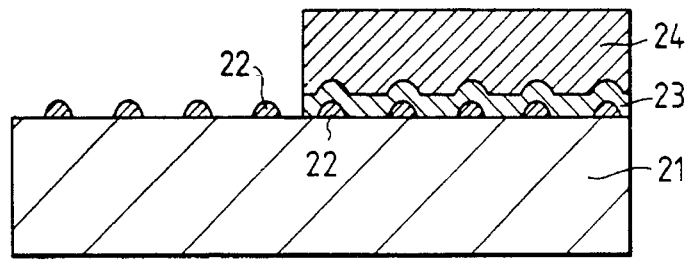
Figure 3C:
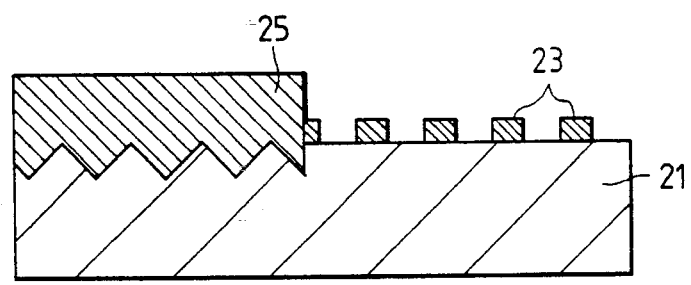

A first resist 22 of a photosensitive resist in the form of a diffraction grating is first formed on a substrate 21 by the interference exposure and an SiNx layer 23 as a coating layer is subsequently formed by the ECR-CVD method. These steps are similar to those described in the first embodiment. The portion intended for the formation of a diffraction grating of the opposite phase (the right-hand half portion in this case) is then covered with a second resist 24 of a photosensitive resist, whereas the SiNx layer 23 which is not covered with the second resist 24 (the other left-hand half portion in this case) is totally removed as shown in FIG. 3(a). Although the rate of etching the SiNx layer 23 positioned on the resist 22 is higher than that of etching the SiNx layer 23 positioned on the substrate 21, a buffer fluoric acid, which will not dissolve the first resist 22, may be used to remove only the SiNx layer 23.

The left-hand half portion of the substrate 21 is subjected to etching in that state to obtain a diffraction grating having the same phase as that of the resist 22 obtained by the interference exposure. After removing the second reist 24, the buffer fluoric acid is employed for etching as in the case of the first embodiment so as to produce the SiNx layer 23 in the form of a diffraction grating. Then a third resist 25 is formed in the left-hand half portion as shown in FIG. 3(a) to cover the substrate 21 thus etched.

Figure 3D:
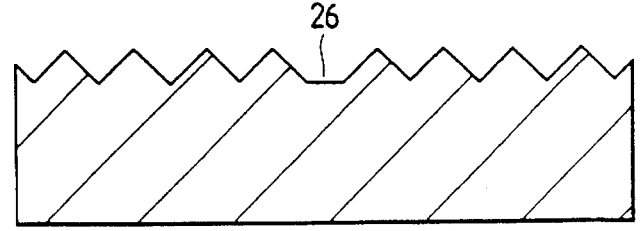

The substrate 21 in the aforesaid state is etched to produce a diffraction grating whose phase is opposite to that of the resist 22 obtained by the interference exposure, so that a portion 26 with a shift of quarter-wavelength is obtained within the boundary between the diffraction grating of the opposite phase and the previously formed diffraction grating whose phase is similar to that of the resist 22 as shown in FIG. 3(d).

FIGS. 4(a)–4(f) are views illustrating a process of producing a diffraction grating in accordance with a third embodiment of the present invention, wherein reference numerals 31, 32, 34 and 36 denote similar components to those designated by 21, 22, 24 and 26 in FIG. 3, respectively, whereas an $SiO_2$ layer 37 is formed by the ECR-CVD method and an SiNx layer 38 is formed by the ECR-CVD method, which is used to protect the substrate 31 etched in the form of a diffraction grating.

Figure 4A:
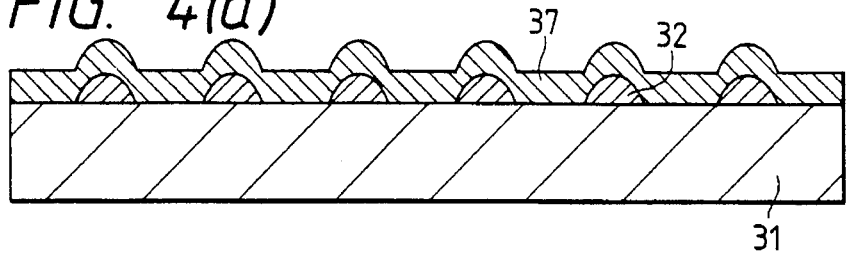
FIGS. 4(a)–4(f) show a process of producing a diffraction grating in accordance with a third embodiment of the present invention.
Figure 4B:
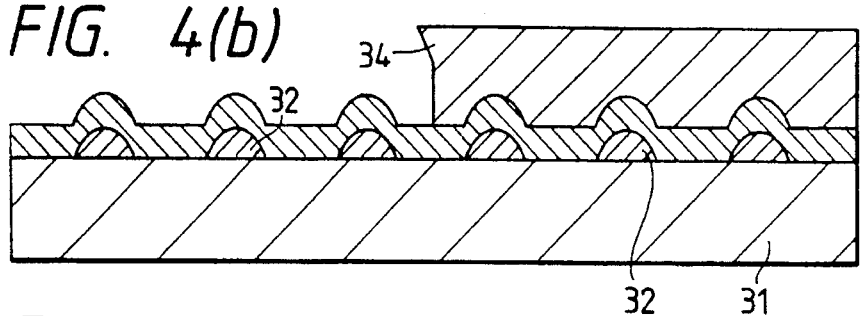

As shown in FIG. 4(a), the $SiO_2$ layer 37 is first formed by the ECR-CVD method on the first resist 32 of a photosensitive resist having the form of interference fringes obtained by the interference exposure.

Figure 4C:
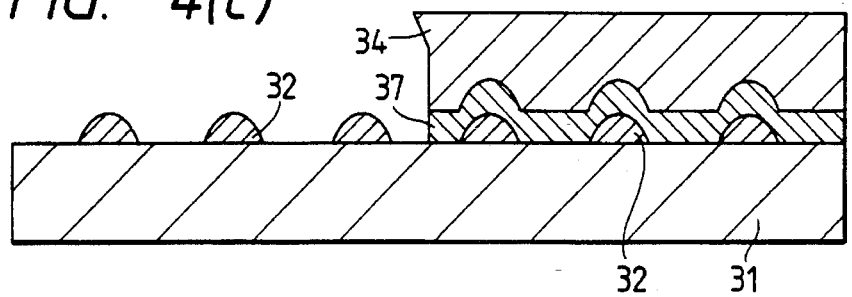

As shown in FIG. 4(c), the second resist 34 of a photosensitive resist is subsequently formed and a buffer fluoric acid is used to remove a part of the $SiO_2$ layer 37 by etching, that part of which is not covered with the second resist 34.

Figure 4D:
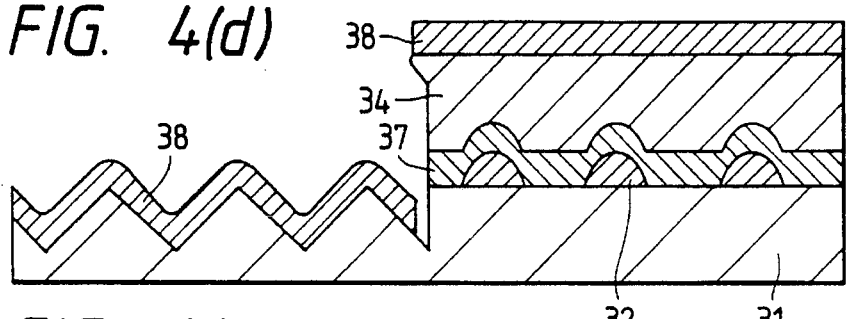
Figure 4E:
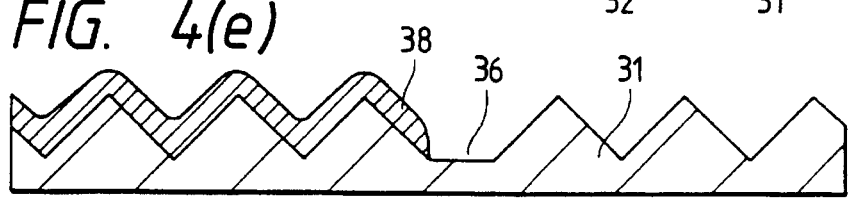

The substrate 31 is then etched with a mask of the first resist 32 and the SiNx layer 38 is formed by the ECR-CVD method as shown in FIG. 4(d).

Next the organic solvent is used to remove the second resist 34, so that the SiNx layer 38 on the second resist 34 is removed likewise by the usual lift-off method. The buffer fluoric acid is further used for etching as in the case of the aforesaid embodiment to remove the $SiO_2$ layer 37 positioned on the first resist 32 as shown in FIG. 4(c). Since the rate of etching the SiNx layer 38 is lower than that of etching the $SiO_2$ layer 37, the former remains unetched and keeps covering the substrate 31, whereas the $SiO_2$ layer 37 positioned on the substrate 31 still subsists since the rate of etching the $SiO_2$ layer 37 positioned on the first resist 32 is higher than that of etching the $SiO_2$ layer 37 positioned on the substrate 31.

Figure 4F:
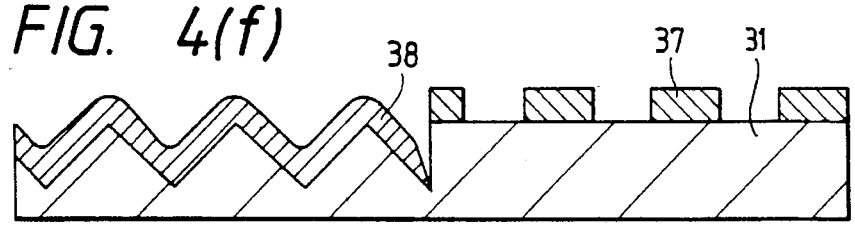

The substrate 31 is then etched with a mask of the $SiO_2$ to produce a diffraction grating opposite in phase to that of the resist 32, so that a portion 36 with a shift of quarter-wavelength is obtained within the boundary between the diffraction grating of the opposite phase and the previously formed diffraction grating whose phase is similar to that of the resist 32 as shown in FIG. 4(f).

FIGS. 5 to 10 are views illustrating a process of producing a diffraction grating, in which etching of a substrate 41 is conducted once, in accordance with a fourth embodiment of the present invention, wherein reference numerals 41, 42, 43, 44, 46 and 47 denote similar or like components to those designated by 31, 32, 37, 34, 36 and 37 in FIG. 4, respectively, whereas there is provided a series of cavities 49 between the substrate 41 and the SiNx layer 43.

Figure 5A:
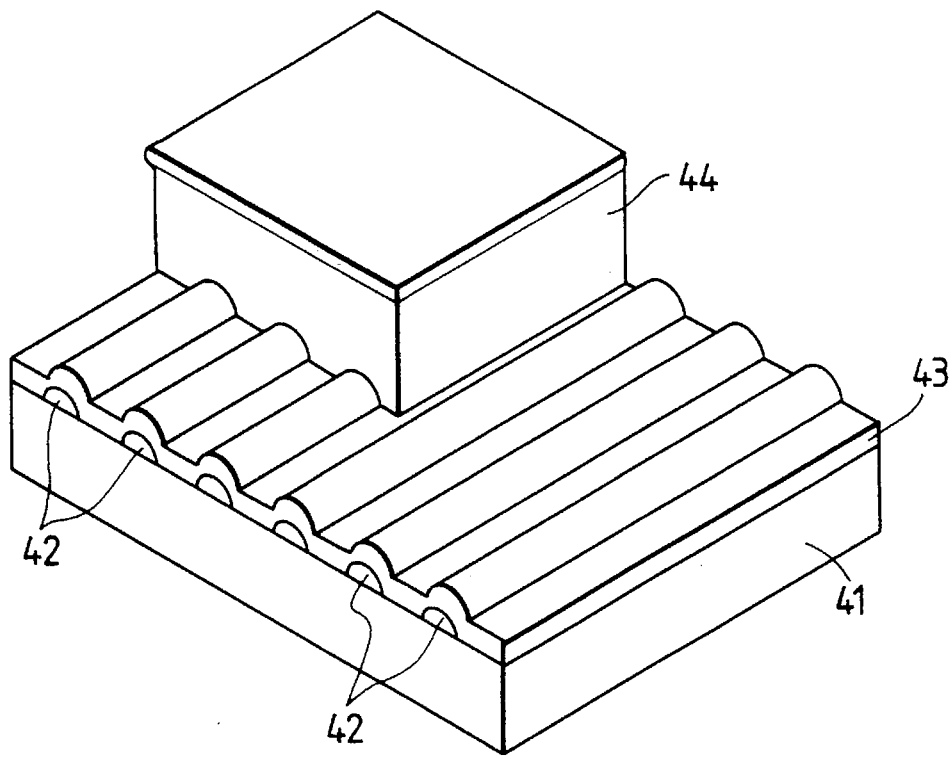
FIGS. 5–10 show a process of producing a diffraction grating in accordance with a fourth embodiment of the present invention.
Figure 5B:
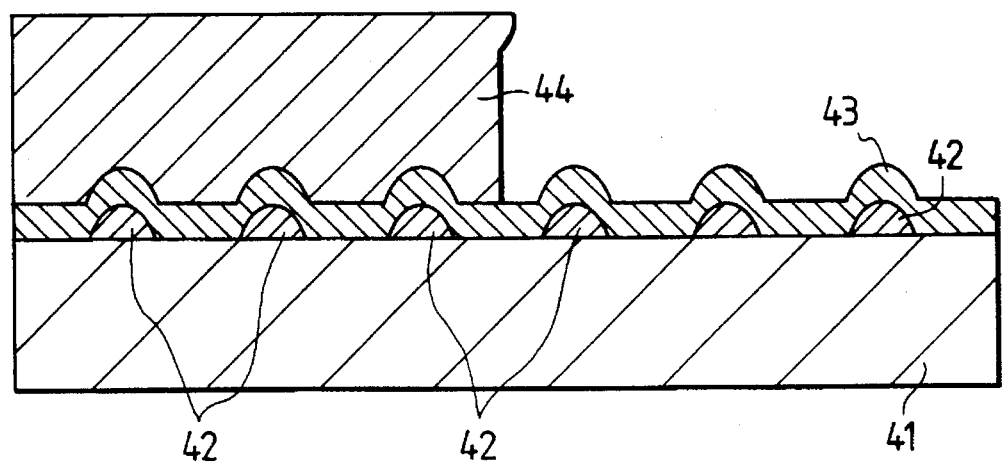

The second resist 44 is formed on the SiNx layer 43 which is formed by the ECR-CVD method on the first resist 42 formed by the interference exposure method into the form of interference fringes. As shown in FIG. 5(a), a part of the left-hand portion of the substrate 41 is left uncovered with the second resist 44 at that time.

Figure 6A:
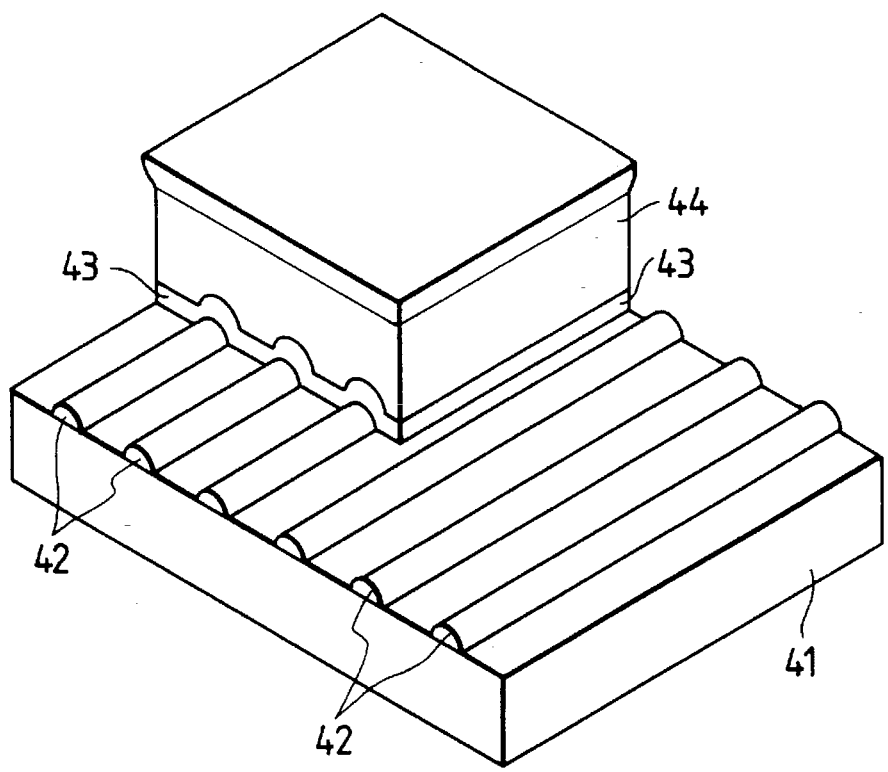
Figure 6B:
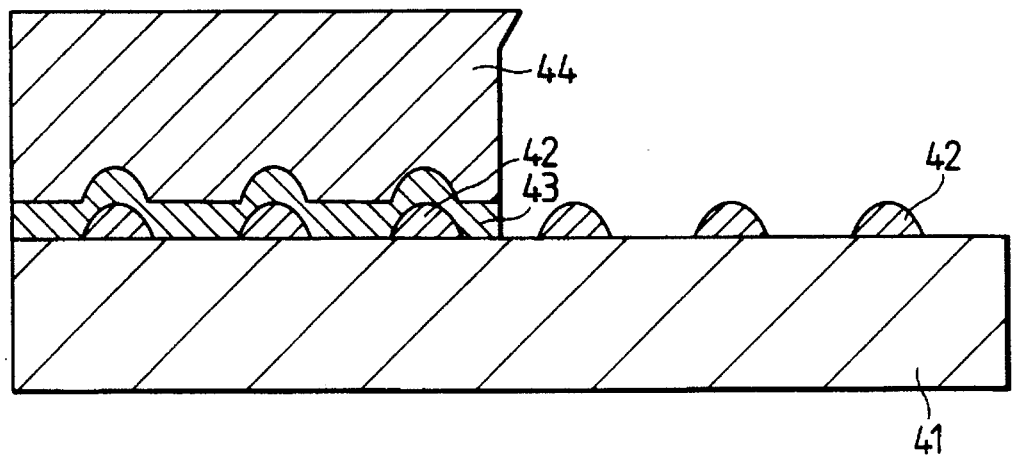

Subsequently, as shown in FIG. 6(a) or 6(b) the SiNx layer 43 without a cover of the second resist 44 is removed.

Figure 7A:
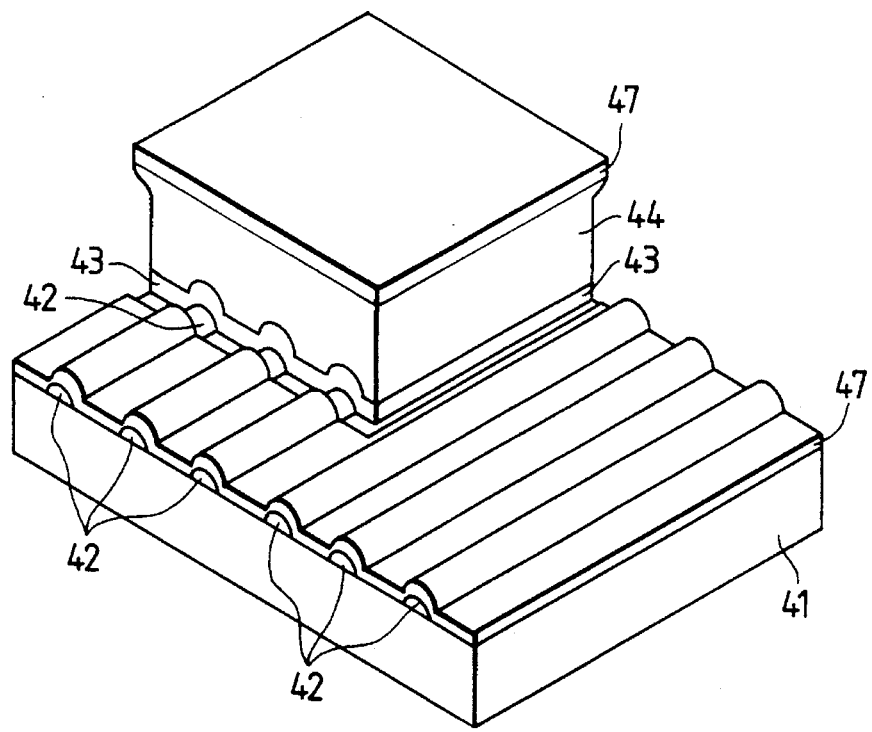
Figure 7B:
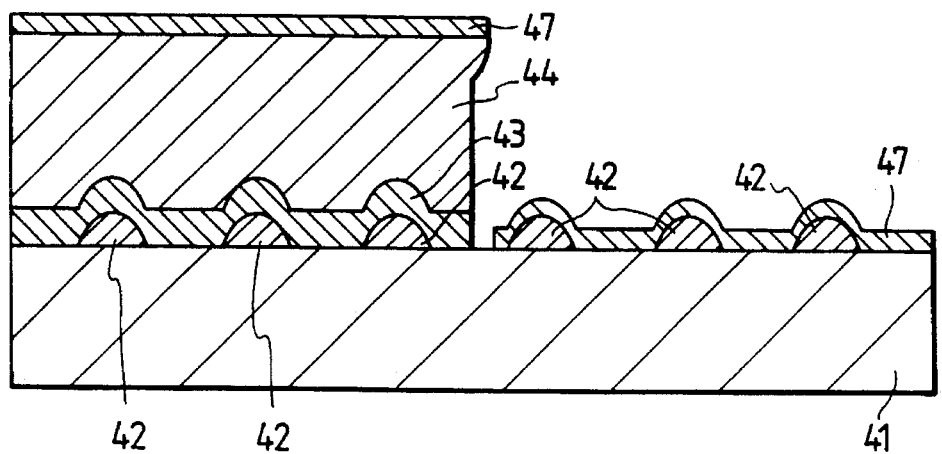

The SiO₂ layer 47 is then formed on the whole surface by the ECR-CVD method as shown in FIG. 7(a) or 7(b). At this time, the second resist 44 is provided with overhanging edges by processing the resist 44 with monochlorobenzene, so that a portion free from the adhesion of the SiO₂ layer 47 may be produced.

Figure 8A:
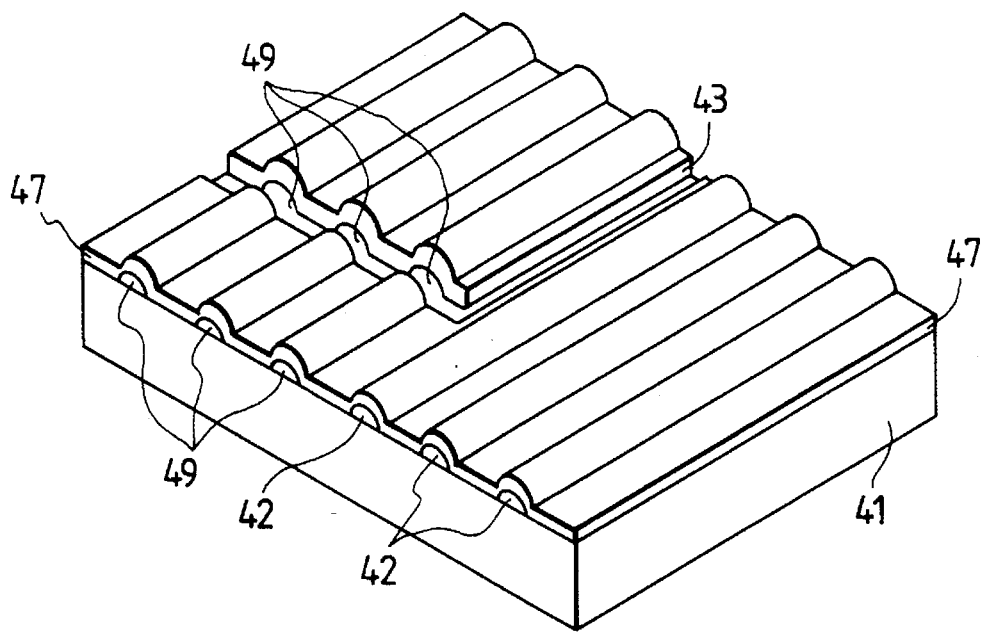
Figure 8B:
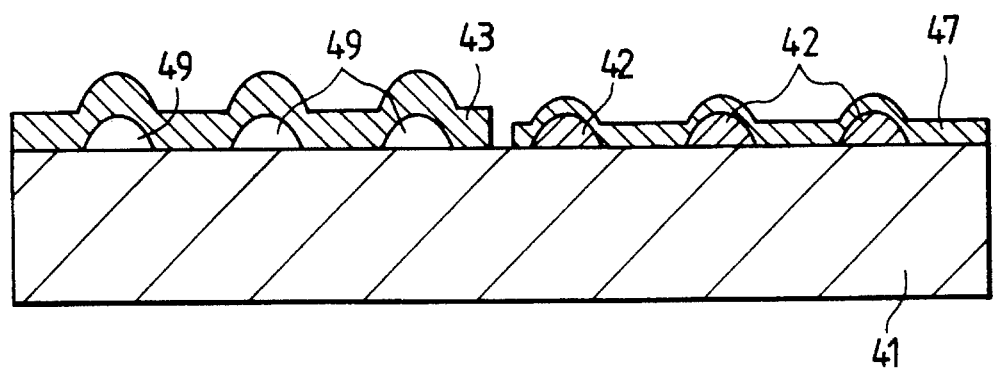

Next an organic solvent is used to remove the second resist 44. The organic solvent percolates through the portion without the adhesion of the SiO₂ layer 47 so that the first resist 42 in the left-hand portion in FIG. 7 is dissolved thereby. As a result, the cavities 49 are thus provided between the substrate 41 and the SiNx layer 43 as shown in FIG. 8(a) or 8(b).

Figure 9A:
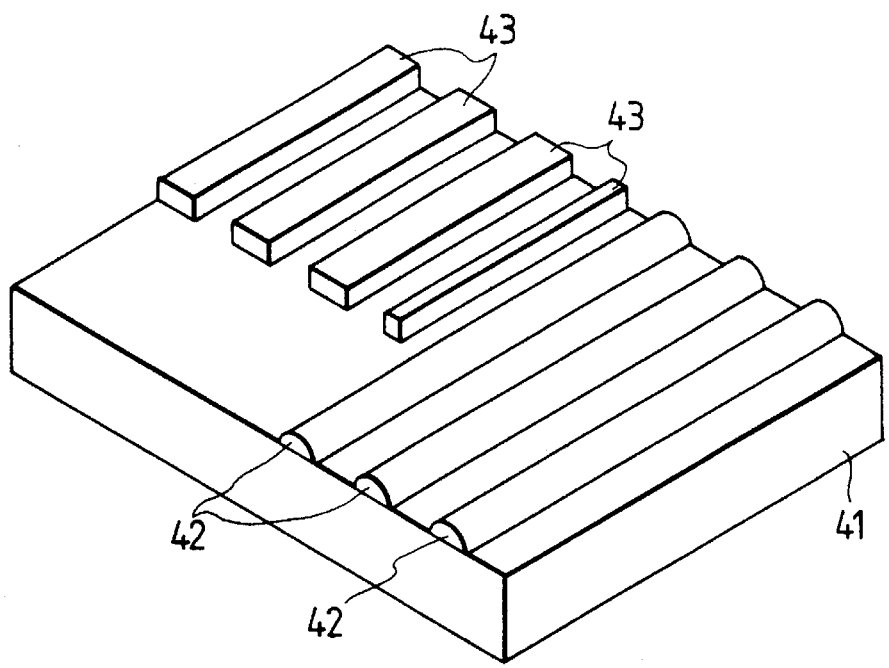
Figure 9B:
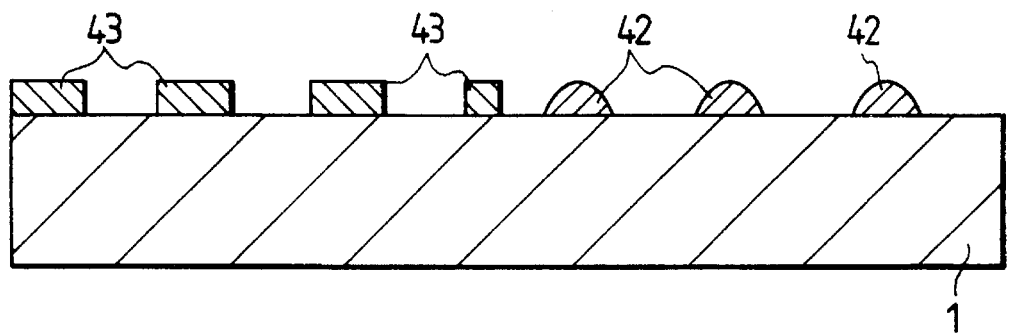

Then a buffer fluoric acid is used for etching as in the case of the aforesaid embodiments to obtain a profile shown in FIG. 9(a) or 9(b). The SiO₂ layer 47 is removed as the rating of etching the SiO₂ layer 47 is higher than that of etching the SiNx layer 43.

Figure 10:
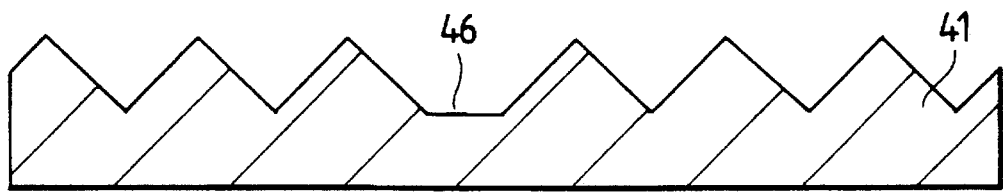

The substrate 41 in that state is etched to obtain a diffraction grating provided with a portion 46 having a shift of quarter-wavelength as shown in FIG. 10.

Although the SiNx films 13, 23, 33 and 43 have been formed by the ECR-CVD method as the coating layers on the resist 12, 22, 32 and 42, respectively, in the aforesaid embodiments 1 to 4, the film for use as a coating layer is not limited thereto and an SiO₂ film, for instance, may be used provided it will not damage the resist 12, 22, 32 and 42 and will not be dissolved by the organic solvent for removing the resist 12, 22, 32 and 42.

Moreover, although the buffer fluoric acid has been used for etching the SiNx layer in the embodiments above, dry-etching may be employed for the purpose.

As set forth above, the process of producing a diffraction grating described in each of the embodiments 1 to 4 comprises the steps of forming the coating layer on the diffraction grating layer formed of the resist of a photosensitive resin, removing a part thereof formed on the diffraction grating of the resin, preparing the diffraction grating layer formed with the coating layer whose phase is opposite to that of the diffraction grating layer of the resin, and etching the substrate with a mask of the former diffraction grating layer. Accordingly, the diffraction grating layer of the resist obtained by the usual interference exposure method becomes usable to obtain a diffraction grating opposite in phase to that of the resist through a simple method.

FIGS. 11(a)–11(f) are views illustrating a process of producing a diffraction grating in accordance with a fifth embodiment of the present invention, wherein there is shown a substrate 51, together with a first resist 52 of a photosensitive resist, a first SiNx layer 53, a second resist 54 of a photosensitive resist for patterning, a second SiNx layer 55, a portion 56 having a phase shift of quarter-wavelength, another portion 57 where a diffraction grating whose phase is similar to that of the first resist 52 is produced, and still another portion 58 where a diffraction grating whose phase is opposite to that of the first resist 52 is produced.

Referring to FIGS. 11(a)–11(f), a process of manufacture in accordance with a fifth embodiment of the present invention will be described.

The process comprises applying the first photosensitive resist 52 onto the substrate 51, subjecting the first resist 52 to the exposure of interference fringes by the two-luminous-flux exposure method, and developing the product resulting therefrom, so that the first resist 52 patterned into a diffraction grating is formed on the substrate 51. These steps are similar to those employed in the conventional interference exposure method.

Figure 11A:
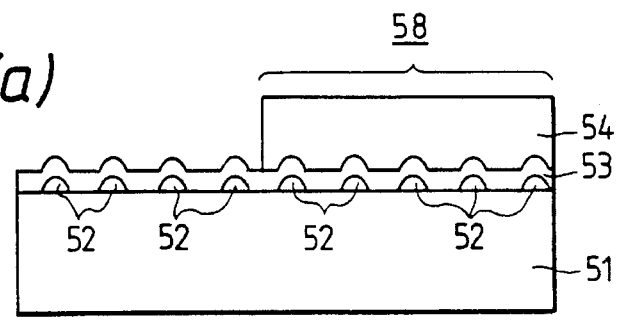
FIGS. 11(a)–11(f) show a process of producing a diffraction grating in accordance with a fifth embodiment of the present invention.
Figure 11B:
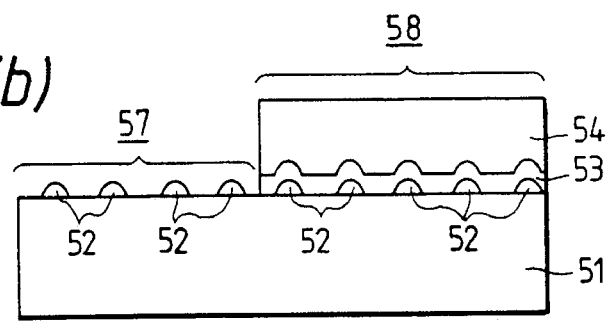

Subsequently, the first SiNx layer 53 of about 300 Å thick as a coating layer on the first resist 52 is formed by the ECR-CVD method. In this ECR-CVD method, the first SiNx layer 53 can be formed without damaging the first resist 52 at low temperatures. Next the second resist 54 is again applied onto the first SiNx layer 53 and patterning is conducted by the usual exposure-developing method. With a mask Of the second resist 54, the first SiNx layer 53 in the same-phase portion 57 of the left-hand half portion is removed by etching as shown in FIG. 11(b).

The substrate 51 in the same-phase portion 57 is etched with a mask of the first resist 52. At this time, the etching time is shortened to remain a flat portion on the substrate 51.

Figure 11C:
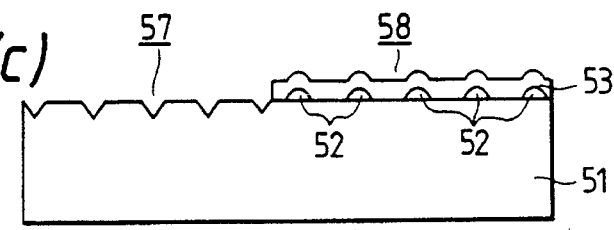
Figure 11D:
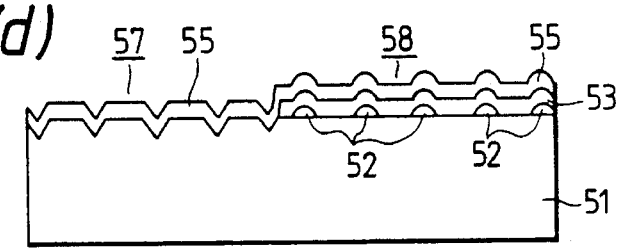
Figure 11E:
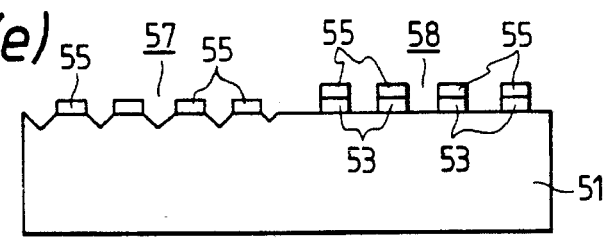

Then, as shown in FIG. 11(c), the first resist 52 in the same-phase portion 57 and the second resist 54 in the reverse-phase portion 58 are removed and, as shown in FIG. 11(d), the second SiNx layer 55 of about 300 Å thick is formed again by the ECR-CVD method on the whole surface thereof.

Figure 11F:
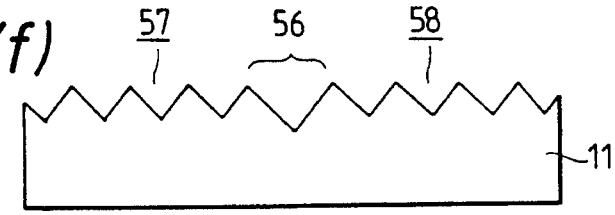

A buffer fluoric acid, for instance, is used for etching. The buffer fluoric acid formed by blending ammonium fluoride and fluoric acid at a ratio of 6 to 1, for instance, is used to conduct etching for about 30 second, whereby the first SiNx layer 53 and the second SiNx layer 55 positioned on the first resist 52 in the reverse-phase portion 58, and the second SiNx layer 55 positioned on the etched portion of the substrate 51 in the same-phase portion 57 are totally etched because the rate of etching each of them is high, whereas the first SiNx layer 53 and the second SiNx layer 55 positioned on the flat portion of the substrate 51 remain intact, as shown in FIG. 11(f), because the rate of etching these layers is low.

The substrate 51 is then etched with a mask of the first SiNx layer 53 and the second SiNx layer 55 after the first resist 52 is removed. Consequently, as shown in FIG. 11(f), a diffraction grating having the same phase as that of the first resist 52 is formed in the same-phase portion 57, whereas a diffraction grating whose phase is opposite to that of the first resist 52 (i.e., with a shift of quarter-wavelength) is produced in the reverse-phase portion 58. A portion 56 with a shift of quarter-wavelength is formed within the boundary between these diffraction gratings.

The state shown in FIG. 11(c) is changed to what is shown in FIG. 11(d) with remaining the first SiNx layer 53 in the fifth embodiment. However, it is possible to form the second SiNx layer 55 after removing the first SiNx layer 53 as shown in FIGS. 12(a)–12(f) in accordance with a sixth embodiment.

Figure 12A:
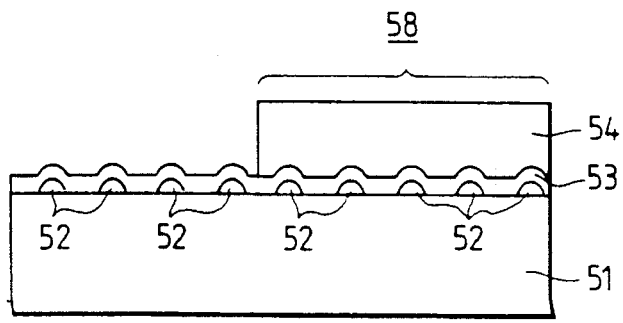
FIGS. 12(a)–12(f) show a process of producing a diffraction grating in accordance with a sixth embodiment of the present invention.
Figure 12B:
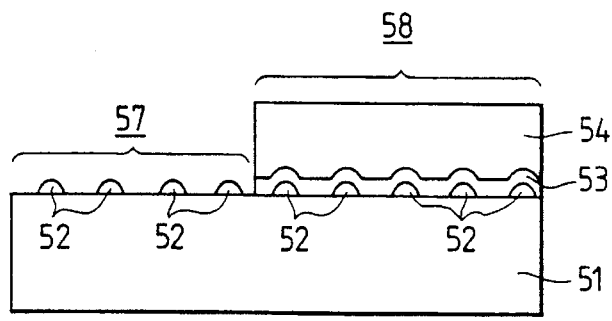
Figure 12C:
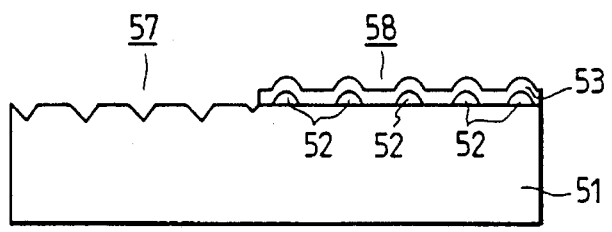
Figure 12D:
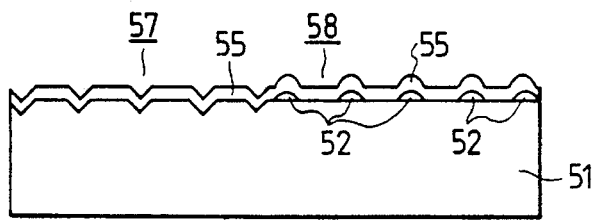
Figure 12E:
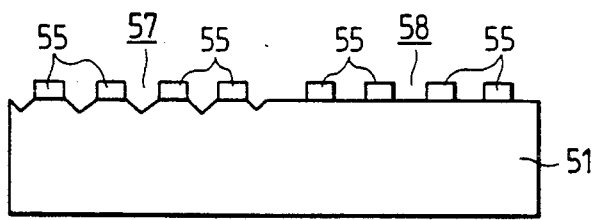
Figure 12F:
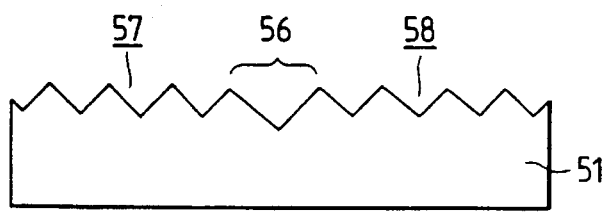

Like the fifth embodiment, the steps shown in FIGS. 12(b) and 12(c) are conducted. Thereafter, the first SiNx layer 53 in the reverse-phase portion 58 is removed by means of the buffer fluoric acid and, as shown in FIG. 12(d), the second SiNx layer 55 is then formed. Subsequently, as shown in FIG. 12(e), the second SiNx layer 55 is etched to form a diffraction grating, which is then used as a mask to etch the substrate 51, so that, as shown in FIG. 12(f), the portion 56 with a shift of quarter-wavelength is obtained within the boundary therebetween as in the case of the fifth embodiment.

The fifth or sixth embodiment comprises the steps of forming the coating layer, which has uniform thickness and insoluble by the solvent for use in dissolving a resist, on a part or the whole of the resist patterned into the diffraction grating on the substrate, removing a part of the coating layer positioned on the resist by etching, and etching the substrate with a mask of the coating layer after the resist is removed. Consequently, a diffraction grating having a portion of a phase shift of quarter-wavelength can be obtained simply and effectively by making use of the diffraction grating pattern formed by the usual interference exposure method.

FIGS. 13(a)–13(d) are views illustrating a process of producing a diffraction grating in accordance with a seventh embodiment of the present invention.

In FIGS. 13(a)–13(d), a substrate 61 patterned into a diffraction grating is formed so that it has high flat sections 61a, low flat sections 61b and steps 61c of boundaries therebetween, these sections being alternately provided. A coating layer 62 is formed on the substrate 61.

Referring to FIGS. 13(a)–13(d), the process of producing the same in accordance with the seventh embodiment will be described.

Figure 13A:
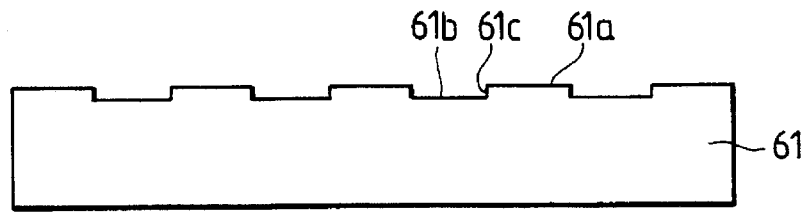
FIGS. 13(a)–13(d) show a process of producing a diffraction grating in accordance with a seventh embodiment of the present invention.

As in the conventional process, etching is conducted so as to leave a flat area in the etched portion by employing a mask of resist (not shown) patterned into a diffraction grating by the two-luminance-flux exposure method, so that the substrate 61 having a diffraction grating pattern is formed, in which the high flat sections 61a and the low flat sections 61b are alternately formed as shown in FIG. 13(a).

Figure 13B:
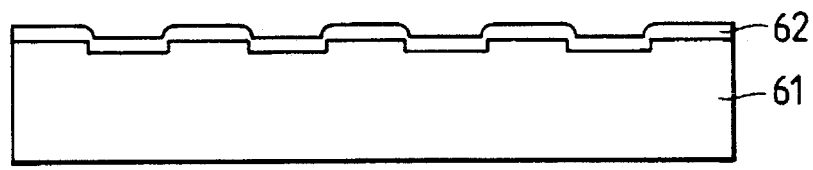

Subsequently, as shown in FIG. 13(b), there is formed a coating layer 62 on the substrate 61, the properties of the coating layer 62 are such that the rate of etching the layer 62 positioned on each step 61(c) is higher than that of etching the same positioned on each flat section. As such a coating layer 62, an SiNx film prepared by the ECR-CVD method utilizing electron cyclotron resonance plasma can be used.

Figure 13C:
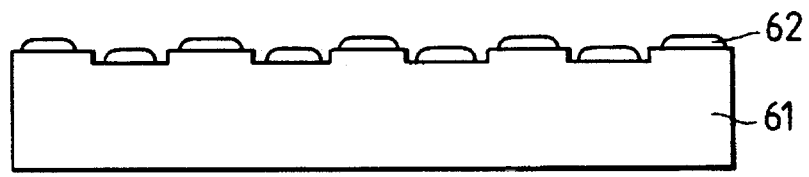

Next, as shown in FIG. 13(c), a buffer fluoric acid is used to etch the coating layer 62 so as to remove a part of the coating layer positioned on and near the steps 61(c). When the SiNx film of 200 Å thick is employed as the coating layer 62, for instance, ammonium fluoride and fluoric acid blended at a ratio of 6 to 1 is used as the buffer fluoric acid and etching is conducted for about 20 seconds, so that the coating layer 62 of the SiNx film positioned on and near the steps 61(c) is removed. On the contrary, the thickness of the coating layer 62 of the SiNx film positioned on the high flat sections 61(a) and the low flat sections 61(b) decreases by about 50 Å only.

Figure 13D:
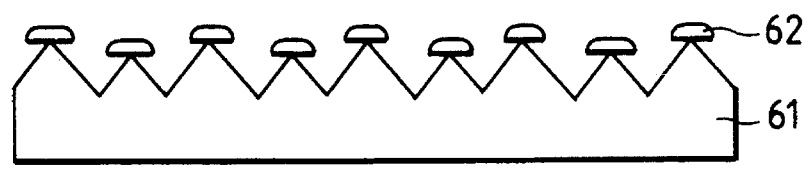

If the substrate 61 is etched with a mask of the coating layer 62 of the SiNx film left on the high flat sections 61(a) and the low flat sections 61(b), etching will be conducted only in the steps 61(c). Consequently, as shown in FIG. 13(d), a diffraction grating with a period half times as large as that of the diffraction grating patterned on the substrate 61 as shown in FIG. 13(a), can be formed.

Although the SiNx film by the ECR-CVD method has been used as the coating layer 62 in the seventh embodiment above, any other one such as an SiO$_2$ film is usable provided the rate of etching the film positioned on the step is higher than that of etching the film on the flat section.

Also, although the resist (not shown) patterned into a diffraction grating by the two-luminous-flux exposure method is used as a mask for etching the substrate 61 in the aforesaid seventh embodiment, it is also possible to use the resist formed by a conventional electron beam exposure method or an exposure method utilizing a photo-mask.

Moreover, although the buffer fluoric acid has been used to etch the coating layer 62 in the embodiment above, dry-etching may be used.

In the seventh embodiment, the process of producing a diffraction grating comprises the steps of forming a diffraction grating pattern wherein the high and low flat sections are alternately arranged on the substrate; forming the coating layer having such properties that the rating of etching the layer positioned on the steps is higher than that of etching the layer positioned on the flat sections; removing the layer positioned on and near the steps between the respective high and low flat sections by etching; and etching the substrate. Accordingly, the diffraction grating with a period half times as large as that of a conventional diffraction grating is obtained, so that a primary diffraction grating for use in a short wavelength DFB laser, the formation of which were difficult, can be easily produced.

Figure 14A:
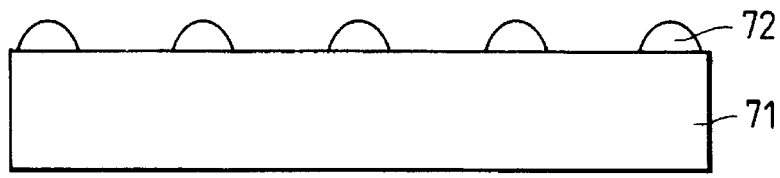
FIGS. 14(a)–14(d) show a process of producing a diffraction grating in accordance with a eighth embodiment of the present invention.

Referring to FIGS. 14(a)–14(d), a process of producing a diffraction grating in accordance with an eighth embodiment of the present invention will be described. In FIGS. 14(a)–14(d), there is shown a substrate 71, together with a resist 72 and an SiNx layer 73 as a coating layer, which is formed by, for example, the ECR-CVD method. The process thereof comprises applying a photosensitive resist to the substrate 71; subjecting the photosensitive resist to the exposure of interference frings by two-luminous-flux exposure; developing the resist and forming resist 72 patterned into a diffraction grating on the substrate 71 as shown in FIG. 14(a). These steps are similar to those taken in the conventional two-luminous-flux -interference exposure method.

Figure 14B:
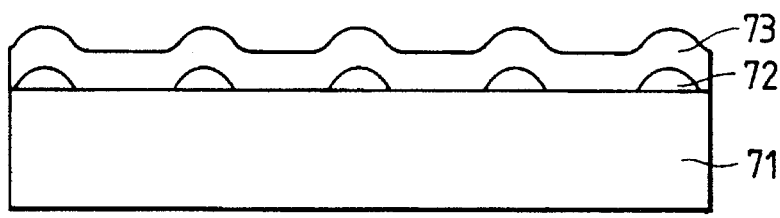

Subsequently, the SiNx layer 73 of about 600 Å thick is formed by the ECR-CVD method as a coating layer as shown in FIG. 14(b). In this case, the SiNx layer 73 as a coating layer can be formed at low temperatures by the ECR-CVD method without damaging the resist 72.

Figure 14C:
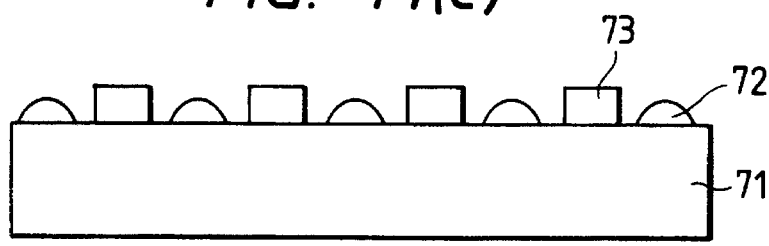
Figure 14D:
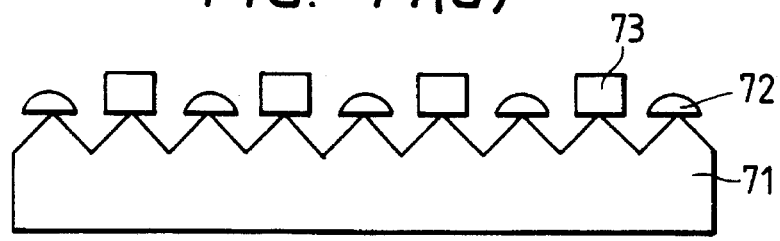

Next, a buffer fluoric acid is used for etching purposes. Ammonium fluoride and fluoric acid blended at a ratio of 6 to 1, for instance, is used as the buffer fluoric acid and etching is conducted for about 40 seconds. Due to the difference in etching rate, the SiNx layer 73 positioned on and near the resist 72 are completely etched, whereas the thickness of the SiNx layer 73 positioned on the substrate 71 merely decreases by about 150 Å. Consequently, as shown in FIG. 14(c), there is produced a second diffraction grating composed of the resist 72, the remaining SiNx layer 73 and the space lacking these two elements, and having a period half times as large as that of the diffraction grating of the resist obtained by the aforesaid two-luminous-flux exposure.

Finally, the substrate 71 is etched with a mask of the diffraction grating composed of the SiNx layer 73 and the resist 72 so that a diffraction grating with a period half times as large as that of the diffraction grating which would be obtained if the substrate 71 were directly etched with a mask of the resist 72, can be formed.

Although the SiNx layer 73 formed by the ECR-CVD method is used as a coating layer in the eighth embodiment, any coating layer can be used in the present invention, provided that the coating layer is formed by a method without damaging the resist 72 and has such properties that the rate of etching a portion of the coating layer positioned on and near the resist 72 is higher than that of etching the remaining one.

Although the SiNx layer has been etched by means of the buffer fluoric acid in the aforesaid embodiment, it may be subjected to dry-etching.

Moreover, the diffraction grating shown in FIG. 14(c) may be used instead of the first diffraction grating shown in FIG. 14(a), so that a diffraction grating having a half period (a period quarter times as large as that of the diffraction grating of the first resist) can be formed in the same manner as described above.

According to the present invention as set forth above, by using the coating layer which can be formed without damaging the resist and whose properties are such that the rate of etching the portion adhering to the resist is higher, the diffraction grating of the resist formed by the usual two-luminous-flux interference exposure method, etc. can be employed to produce a diffraction grating with a period half times as large as the origin. Accordingly, a diffraction grating having a short period such as a primary diffraction grating intended for use in a short wavelength DFB laser, the formation of which were conventionally difficult, can readily be obtained.

What is claimed is:

1. A process of producing a diffraction grating, comprising the steps of:
   forming a diffraction grating pattern on a substrate with high and low flat sections alternately arranged thereon;
   forming a coating layer on said substrate, said coating layer having properties such that the rate of etching said coating layer positioned on each step between said high and low flat sections is higher than that of etching said coating layer positioned on said flat sections;
   etching said coating layer to remove a portion of the coating layer positioned on and near said each step; and
   etching said substrate with a mask of said coating layer left unremoved on said substrate.

2. A process as claimed in claim 1, wherein said low flat section is formed in such a way that a flat area remains in an etched portion by employing a mask of resist patterned into a diffraction grading.

3. A process as claimed in claim 1, wherein said coating layer is formed by an electron cyclotron resonance plasma chemical vapor deposition method.

4. A process as claimed in claim 1, wherein said coating layer is formed of a silicon nitride or a silicon oxide.

5. A process as claimed in claim 4, wherein said coating layer is etched by a buffer fluoric acid to form said second diffraction grating layer.

6. A process of producing a diffraction grating, comprising the steps of:
   producing a coating layer on a first diffraction grating layer of resin formed on a substrate;
   removing by etching a part of said coating layer positioned on and near said diffraction grating layer of said resin so as to form a second diffraction grating layer which includes repetition of said remaining coating layer, said resin on said substrate and a space between said coating layer and said resin and whose period is half times as large as that of said first diffraction grating; and
   producing said diffraction grating having a period half times as large as that of said first diffraction grating layer by etching said substrate with a mask of said second diffraction grating layer.

7. A process as claimed in claim 6, wherein said coating layer is prepared by an electron cyclotron resonance-plasma chemical vapor deposition method.

8. A process as claimed in claim 6, wherein said coating layer is made of either a SiNx or a SiO$_2$ film.

9. A process as claimed in claim 8, wherein a buffer fluoric acid or dry-etching is employed to selectively remove said coating layer positioned on and near said first diffraction grating layer.

10. A process of producing a diffraction grating, comprising the steps of:
    forming a first layer on a substrate;
    providing a first diffraction grating layer by patterning said first layer;
    forming low flat sections having steps on a first portion of said substrate where a half period portion is formed, by etching with a mask of said first diffraction grating layer;
    removing said first diffraction grating layer on said first portion;
    forming a second layer on an exposed surface of said substrate and a second portion of said substrate where a reverse-phase portion is formed, a material making said second layer being different from a material of said first layer and being such that the rate of etching said second layer positioned on said first diffraction grating layer and said steps of said substrate is faster than that of etching said material positioned on said flat sections of said substrate;
    converting said second layer into a second diffraction grating layer by removing said second layer positioned on said first diffraction grating layer, said steps of said substrate and the surrounding areas thereof through etching;
    removing the remainder of said first diffraction grating layer; and
    forming a diffraction grating having said half period portion and the reverse-phase portion on said substrate, by etching said substrate with a mask of said second diffraction grating layer.

11. A process as claimed in claim 10, wherein said first layer is made of a photosensitive resist and said second layer is made of a silicon nitride.

12. A process as claimed in claim 11, wherein said second layer is formed by an electron cyclotron resonance-plasma chemical vapor deposition method.

13. A process as claimed in claim 11, wherein an etching material for use when said second layer is etched to obtain said second diffraction grating layer is a buffer fluoric acid.

14. A process of producing a diffraction grating, comprising the steps of:
    forming a first layer on a substrate;
    providing a first diffraction grating layer by patterning said first layer;
    forming a second layer on said first diffraction grating layer and an exposed surface of said substrate, said second layer being made of a material different from what makes said first layer, said material forming said second layer being such that the rate of etching said material positioned on said first diffraction grating layer is higher than that of etching said material positioned on said substrate;
    forming a second diffraction grating layer by etching said second layer to remove said second layer positioned on and near said first diffraction grating layer;
    removing said first diffraction grating layer in a portion of said substrate where a reverse-phase portion is formed; and
    forming a diffraction grating having the half period and the reverse-phase portion on said substrate by etching said substrate with a mask of said second diffraction grating layer and the remaining first diffraction grating layer.

15. A process as claimed in claim 14, wherein said first layer is made of a photosensitive resist and said second layer is formed of a silicon nitride or a silicon oxide.

16. A process as claimed in claim 15, wherein said second layer is formed by an electron cyclotron resonance plasma chemical vapor deposition method.

17. A process as claimed in claim 15, wherein an etching material for use when said second layer is etched to obtain said second diffraction grating layer is a buffer fluoric acid.

* * * * *